(12) United States Patent
Bell

(10) Patent No.: US 6,423,457 B1
(45) Date of Patent: Jul. 23, 2002

(54) IN-SITU PROCESS FOR MONITORING LATERAL PHOTORESIST ETCHING

(75) Inventor: Scott A. Bell, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/492,744

(22) Filed: Jan. 27, 2000

(51) Int. Cl.[7] .............................. G03F 7/40; G03F 7/36
(52) U.S. Cl. ...................... 430/30; 430/317; 430/318; 430/313
(58) Field of Search .................. 430/30, 317, 318, 430/313

(56) References Cited

U.S. PATENT DOCUMENTS 5,139,904 A * 8/1992 Auda et al. .................. 430/30

OTHER PUBLICATIONS

S. Wolf and R.N. Taulber "Silicon Processing for the VLSI Era" vol. 1, Latice press 1986, pp. 447–458 and pp. 565–574.

* cited by examiner

Primary Examiner—Cynthia Hamilton

(57) ABSTRACT

Photoresist mask width dimensions are measured by detecting a reflected light during etching or depositing material on the sidewalls of the photoresist mask in a plasma chamber having an etchant mixture. Embodiments include determining the time to stop the etching of the photoresist mask by detecting a corresponding change in the intensity of the reflected light.

20 Claims, 1 Drawing Sheet

IN-SITU PROCESS FOR MONITORING LATERAL PHOTORESIST ETCHING

TECHNICAL FIELD

The present invention relates to a method of manufacturing a semiconductor device wherein a multilayered structure is etched to form a patterned feature therein. The invention is particularly applicable to methods for monitoring etching a photoresist mask overlaying a polysilicon layer to form a semiconductor device.

BACKGROUND ART

The escalating requirements for high density and performance associated with ultra large scale integration (ULSI) semiconductor devices require smaller design features, increased transistor and circuit speeds, high reliability and increased manufacturing throughput for competitiveness. As the devices and features shrink, and as the drive for higher performing devices escalates, problems are generated that require resolution in terms of new methods of fabrication or new arrangements or both.

In general, semiconductor devices comprise a substrate and elements such as transistors and/or memory cells thereon. Metal-oxide-semiconductor (MOS) type devices are typical of modern integrated circuits and typically comprise a pair of ion implanted source/drain regions in a semiconductor substrate and a channel region between the source/drain regions. A gate arrangement is then formed by depositing a thin gate oxide above the channel region followed by the deposition of a composite layer on the gate oxide to act as a gate electrode. The composite layer typically comprises one or more conductive layers which typically includes a layer of polysilicon.

Of particular importance in memory and logic devices is the formation and dimensional control of the gate electrode. Gate dimensions are critical since the gate electrode of the device controls the flow of electrons and is vital to proper device operation. As discussed above, a gate structure is formed by depositing a conductive layer at a uniform thickness which is then typically followed by the deposition of an antireflective film on the conductive layer. A patterned photoresist or mask is then formed by depositing and patterning a photoresist material on the antireflective film followed by etching through the film and multiple layers to ultimately form the desired gate structure.

The basic photolithographic system conventionally employed in forming these features consists of a light source, a stencil or photomask containing the pattern to be transferred to the semiconductor substrate, a collection of lenses, and a means for aligning existing patterns on the substrate with patterns on the mask. The resolution of an optical projection system such as a lithography system is limited in practice and can range from 0.8 down to 0.3 micron for standard exposure systems. The highest resolution in optical lithography is currently achieved with deep ultra violet (DUV) systems operating at 248 nm wavelengths but mid ultra violet (MUV) systems with a wavelength of 356 nm are also in widespread use.

The limits of photolithography are now being challenged, however, by the manufacture of high-performance logic and memory technologies. These technologies are entering development cycles with immediate requirements for subquarter micron, or less, printed gate lengths and tight dimensional control on the gate structures across large chip areas. Since fabrication of a gate arrangement requires the further step of etching through the patterned photoresist, the gate arrangement is approximately limited to the resolution obtained in the photolithographic process. Resolving narrower line widths than those formed by the photolithographic process requires additionally demanding processing steps. Moreover, resolving the spaces between photoresist lines and other small areas using conventional lithographic techniques is considerably more difficult.

A common technique that compensates for the inherent deficiencies of optical photolithography to produce finer line widths is accomplished by etching the sidewalls of a formed photoresist mask prior to etching through the photoresist mask to form the gate structure. This trimming process is achieved by adjusting the etching parameters to etch the sidewalls of a photoresist mask to reduce the width of the elements defined by the photoresist mask. In accordance with conventional techniques, a patterned photoresist layer is placed in a plasma etching environment for a fixed period of time under prescribed etching conditions to etch the sidewalls of the photoresist mask thereby reducing the line width of the patterned photoresist.

The time and etching parameters necessary to achieve the appropriate width reduction is empirically determined by adjusting various etch parameters and, in a separate step, measuring the resulting line widths, as by scanning electron microscopy. The procedure is repeated until the appropriate time and parameters have been determined for a given pattern density. Then, batches of semiconductor substrates with an overlaying photoresist mask are repeatedly processed with the empirically determined parameters. Conventional trimming processes, however, fail to account for variations during the individual wafer processes, such as fluctuating chamber conditions, process parameter fluctuations etc. or for a changed pattern density on the substrate to be etched.

Systems for determining the completion of an etching process through an underlayer are known (see, e.g. S. Wolf and R. N. Taulber "Silicon Processing for the VLSI Era", vol. 1, Latice Press 1986, pp. 447–458 and pp. 565–567). For example, laser interferometry and optical emission spectroscopy have been used to measure the time for complete etching through an underlayer, particularly complete etching through an underlying silicon oxide, polysilicon or aluminum layer. However, it is believed that the art has not recognized a method of determining the completion of an etch step by measuring or monitoring the actual lateral, e.g. width, dimensions of a photoresist element during etching.

As the gate electrode critical dimensions shrink, process variations become increasingly intolerable. Thus, there is a need for a method of determining the dimensions of a line width during the trimming process. Further, it would be highly advantageous to develop a process capable of controlling the line width dimensions, to minimize processing variations and to precisely control gate electrode dimensions during photoresist mask etching.

SUMMARY OF THE INVENTION

An advantage of the present invention is a method of etching a photoresist mask having a plurality of elements by accurately etching and monitoring the width of the elements.

Another advantage of the present invention is a method for etching a feature in a semiconductor substrate by accurately controlling the lateral dimensions of an overlaying photoresist mask.

Additional advantages and other features of the invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by a method of laterally processing, i.e. etching or depositing material on the sidewalls, of a photoresist mask on a substrate. The method comprises laterally processing a photoresist mask oil a substrate, which method comprises: depositing a layer of photoresist material on the substrate; patterning the photoresist layer to form a photoresist mask having at least one element with a first prescribed width; laterally processing the photoresist mask having the element to a second prescribed width in a plasma chamber having an etchant mixture; impinging a light on the substrate and detecting the reflected light from the substrate while simultaneously laterally processing the photoresist mask; and terminating the lateral process in response to a change detected in the reflected light corresponding to the second width.

By monitoring the dimensions of photoresist elements during laterally processing the photoresist mask, the present invention advantageously provides an in-situ method for determining the optimum time for complete lateral processing of the photoresist mask. The impinging light can be that of a laser, e.g. a He—Ne laser, and the detector can be a photodetector or a photomultiplier tube, for example, as is conventionally employed in layer thickness measurements.

Another aspect of the present invention is a method of etching a feature on a semiconductor substrate. The method comprises: forming a dielectric layer on the semiconductor substrate; forming a conductive layer on the dielectric layer; forming a photoresist mask having at least one element having a first width on the conductive layer; laterally processing the photoresist mask having the element to a second prescribed width in a plasma chamber having an etchant mixture; impinging a light on the substrate and detecting the reflected light from the substrate while simultaneously laterally processing the photoresist mask; terminating the lateral process in response to a change detected in the reflected light corresponding to the second width; and etching through the photoresist mask having the element with the second width to the underlying layers to form the feature.

Additional advantages of the present invention will become readily apparent to those having ordinary skill in the art from the following detailed description, wherein the embodiments of the present invention are described, simply by way of illustration of the best mode contemplated for carrying out the present invention. As will be realized, the invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWING

The various features and advantages of the present invention will become more apparent as a detailed description of the embodiments thereof is given with reference to the appended figure described below.

DESCRIPTION OF THE INVENTION

The present invention addresses and solves the problem of random and systematic variations in photoresist mask trimming and deposition processes caused by variations in the plasma etching chamber, fluctuations in process parameters, varied pattern densities, etc. by an in-situ monitoring technique preformed during the trim procedure. The present invention enables the manufacture of semiconductor devices, particularly logic and semiconductor memory devices having submicron features, with improved critical dimensional control of a gate electrode in a cost effective manner with an attendant increase in device performance and uniformity of device performance. Embodiments of the present invention include assessing the removal or deposition on the sidewalls of elements comprising a photoresist mask and determining the precise time that a desired reduced or increased dimension has been achieved, thereby improving the overall efficiency, quality and uniformity of the resulting device.

Figure 1:
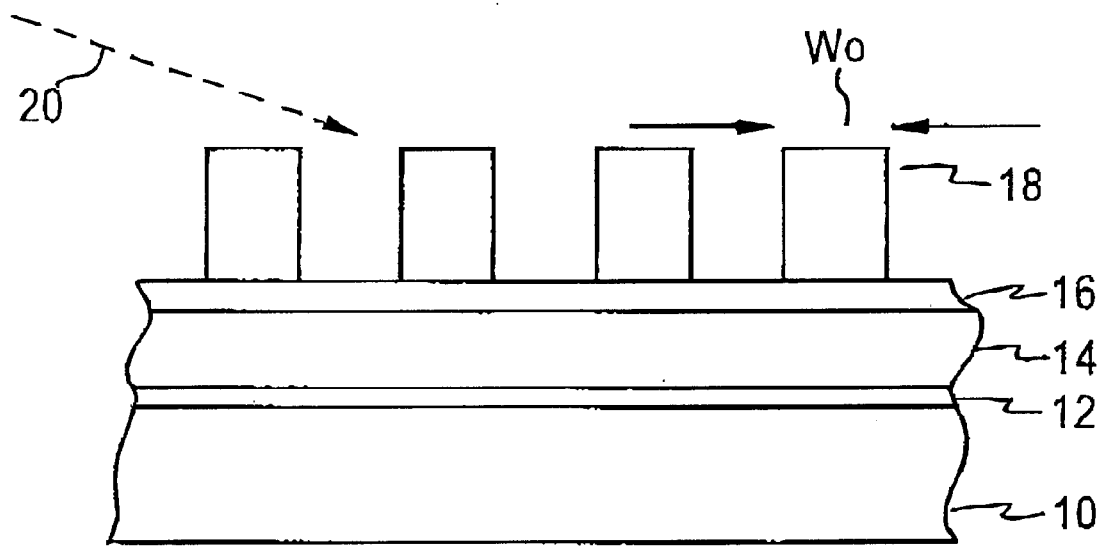
FIG. 1 is a diagram illustrating a cross-sectional view of a portion of a composite structure having a photoresist mask thereon prior to etching.

An embodiment of the present invention is illustrated in FIG. 1 with respect to forming a gate electrode of either a memory or logic type device. As illustrated in FIG. 1, substrate 10 has dielectric layer 12 thereon, conductive layer 14 overlays dielectric layer 12, antireflective coating (ARC) 16 overlays conductive layer 14 and a photoresist mask having as elements photoresist lines 18 is on ARC 16. In very large scale integrated circuit applications, substrate 10 has several million (soon to be over a billion) of such gate electrodes.

Dielectric layer 12 can comprise inorganic layers such as silicon dioxide, silicon nitride, silicon oxynitride, etc. Conductive layer 14 typically comprises polysilicon with one or more conductive layers such as a silicide layer or other similar low electrically resistant materials, ARC 16 typically comprises a nitride of silicon or a nitride of a metal such as titanium.

Additional device dependant layers can be further deposited depending on the particular device contemplated. For example, a silicide layer can further be formed on conductive layer 14 using conventional silicide forming techniques to a thickness of about 100 to about 1,000 Angstroms. In the manufacture of memory devices, an interpoly dielectric layer overlying on conductive layer 14 would be formed along with a second polysilicon layer overlying on the interpoly dielectric layer and then the photoresist mask overlying the second polysilicon layer.

The layers of the present invention are configured for the formation of sub-micron gate electrodes and have a height of between about 1,500 Angstroms to about 5,000 Angstroms. For example, dielectric layer 12 can be a gate oxide layer of less than about 50 Angstroms thick, thermally grown on substrate 10. Conductive layer 14 can be a doped polysilicon layer formed on the tunnel oxide using conventional chemical vapor deposition (CVD) or plasma enhanced chemical vapor deposition (PECVD) techniques to a thickness of about 900 to about 2,000 Angstroms. An antireflective coating (ARC) film 16, used for many reduced-size critical dimension semiconductor devices can then be deposited overlying the polysilicon layer using conventional CVD or PECVD techniques. In an embodiment of the present invention, a silicon oxynitride film serves as the antireflective coating film. Although an embodiment uses silicon oxynitride as the antireflective film 16, alternative ARC materials can be used that include a controllable atomic percentage of nitrogen, for example, silicon oxime. The ARC 16, typically a silicon oxynitride film, is formed to a thickness of about 300 Å.

The photoresist is then patterned on ARC 16 to generate a photoresist mask at a thickness of about 5,400 Angstroms having pattern lines and spaces. To achieve high density, the photoresist mask is typically formed by a deep ultraviolet (DUV) radiation sensitive photoresist capable of achieving line width resolutions of about 0.30 to about 0.20 micron. During the photolithographic process, radiation is passed through a photomask defining a desired pattern to image-wise expose a layer of photoresist material on the substrate. After exposure to radiation, the photoresist layer is developed, typically by a liquid developer, to form a relief pattern therein having a plurality of elements. The plurality of elements can comprise various geometrical shapes including lines, pads, columns, etc.

As shown in FIG. 1, the plurality of elements comprises a series of lines and spaces. The sidewalls of the photoresist elements define a first width, shown as $W_0$ in the figure, which is achieved after development of the photoresist layer and would otherwise be the resolution of the underlying layer after etching without further processing of the photoresist mask. Hence, resolution of finer line widths or smaller spaces between elements (smaller spaces can be achieved by increased line widths) requires additional processing of the photoresist mask.

According to the present invention, the semiconductor substrate, as shown in FIG. 1, is inserted into an etch chamber and the photoresist mask having plurality of elements 18 is then etched in a plasma etch chamber to a second width. The plasma etch chamber has an etchant mixture, the composition of which can be adjusted to either increase or decrease the width of the photoresist elements. Additionally, the plasma chamber parameters, such as pressure and power, can be adjusted to modulate the second width of the photoresist mask.

As is known in the art, plasma etching of a photoresist mask involves competing etching and deposition processes. By adjusting the ratio of the etchant composition, the line width of the photoresist can be controlled during etching of the photoresist mask in an plasma etching environment thereby overcoming the resolution limit of current DUV techniques. The line width can be controlled to either an increased or decreased horizontal dimension, i.e. laterally processed, with the attendant control over the resolution of spaces and ultimate control over the gate electrode dimension.

In accordance with the present invention, a semiconductor substrate is placed into a plasma etch tool and the chamber conditioned. Given the guidance and objectives of the present disclosure, the optimum etching conditions can be necessarily determined in a particular situation. For example, the chamber pressure is maintained at about 3 mTorr to about 200 mTorr and the tool power set at about 200 Watts (W) to about 1,000 W. The temperature of the substrate is maintained at about 0° C. to about 65° C. The total gas inlet flow is maintained at about 50 standard cubic centimeters per minute (sccm) to about 200 sccm.

In an embodiment of the present invention, a photoresist mask overlaying a composite arrangement comprising a semiconductor substrate having a gate oxide thereon, a layer of polysilicon on the gate oxide and an ARC on the polysilicon is placed in a commercially available plasma etch tool having at least one window for impinging light on the substrate and detecting the reflected light from the substrate. According to the disclosed embodiment, the photoresist mask is selectively etched in order to increase or decrease the width of photoresist elements using a single-chamber etching process. In particular, an embodiment of the present invention uses a decoupled plasma source (DPS) poly chamber from Applied Materials, Inc., Santa Clara, Calif., for example an Applied Materials AMAT DPS Poly chamber. Normal plasma etch tools use a single power source, referred to as a "source power", with the wafers electrically grounded; alternately, the wafers may be attached to the source power, and the chamber is electrically grounded. The plasma etch tool controls the source power and affects how much plasma is generated, and also controls the concentration of reactive species, and hence how the reactive species lands on the wafer.

In the decoupled plasma source etcher, the power supply is separated into a source power and a bias power. The source power is high power supplied to coils or other such electrodes. The bias power (or "bottom power") power is connected to the wafer. The source power ionizes the gas supplied into the chamber, and generates the reactive species in the chamber. The bias power on the wafer drives the reactive species to accelerate the reactions. Hence, there is more control of the etching process: the source power controls generation of the chemical species and therefore controls the chemical etch portion, and the bias power controls the physical part of the etch, for example the bombardment of the species onto the wafer.

To facilitate control over the width of the photoresist elements during the etch step, changes to the dimension of the photoresist mask are monitored by impinging a light on the substrate and detecting for changes in the light reflected from the substrate. In accordance with the present invention, an increase or decrease in the width of the photoresist mask results in a corresponding change in the reflected light.

In an embodiment of the present invention, the impinging light and detector can be carried out by using an interferometer (see, e.g. S. Wolf and R. N. Taulber "Silicon Processing for the VLSI Era", vol. 1, Latice Press 1986, pages 565–567). An interferometer, such as an InspecStep In-situ Interferometer, manufactured by Litel Instruments, Inc. of San Diego, Calif., can be adapted to the present invention. In an embodiment of the present invention, the light emanating from a laser beam, e.g. a He—Ne laser, is directed through a window of an etching chamber on to the photoresist mask overlaying a substrate, shown as line 20 in FIG. 1, while the photoresist mask is undergoing lateral processing in the plasma chamber. The light reflected is then detected through the same window or through a separate window in the etch chamber by a photocell, e.g. a photomultiplier tube.

In an embodiment of the present invention, a laser light of about 1 mm to about 5 mm is focused on an array of pattern lines having an initial width of about 0.3 micron to about 0.2 micron. The lines are then etched in a plasma chamber to a second width of less than about 0.18 micron. As the width of the lines change to the second width, the intensity of the reflected light detected during the etching process correspondingly changes to a second intensity. Changes in detected reflected light intensities corresponding to precise line width can be experimentally determined for a given photoresist pattern and, hence, the precise line width can be determined while the photoresist mask is in the etching chamber.

Figure 2:
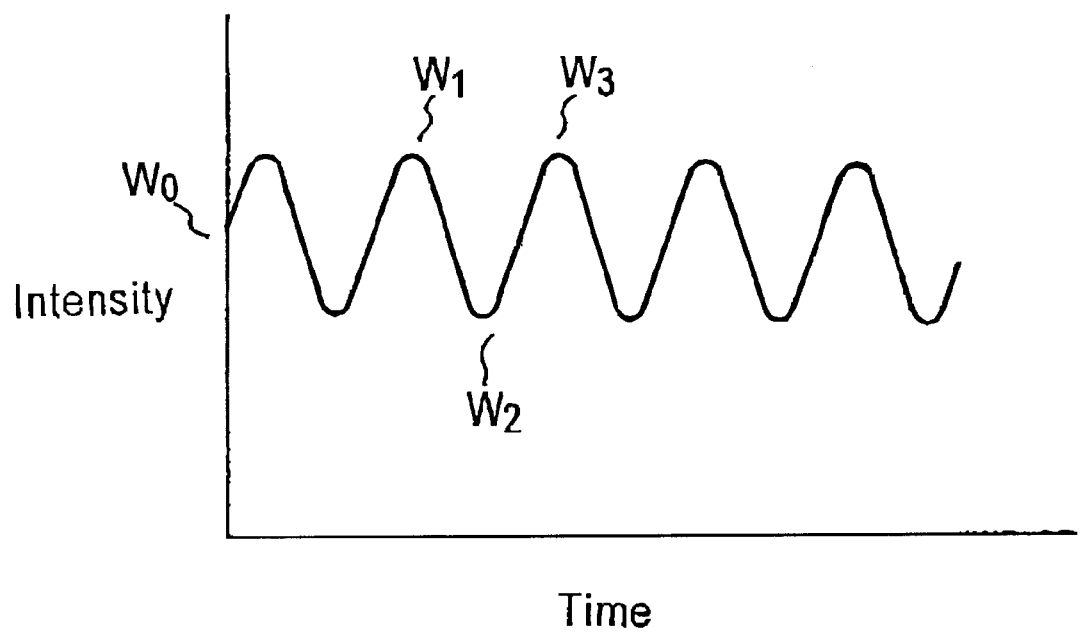
FIG. 2 is a graph illustrating the correlation between detected light intensity and line width of the present invention.

As shown in FIG. 2, the detected reflected light can be calibrated to record an initial intensity, i.e. $W_0$. Continuously changing line widths during etch causes a continuous change in the interference pattern (constructive and destructive interference $W_1$, $W_2$, $W_3$) in the measured reflected intensity. The measured output is expected to have a sinusoidal element which can be experimentally (and possibly even theoretically) determined. As shown in FIG. 2, during a constant reduction of the width of a photoresist element, the reflected intensity changes sinusiodally over time. Different reflected intensities can be correlated to particular widths of a given photoresist pattern. In an embodiment of the present invention, when the desired width dimension is achieved, as determined by the corresponding reflected intensity, the lateral processing is stopped and the substrate prepared for subsequent processing to form the gate electrode.

There is also a point in time during etching of the sidewalls of the photoresist mask when no further etching occurs (i.e. a saturation point) depending on the etch conditions used. According to an embodiment of the present invention, the saturation point can be determined by monitoring the reflected light for no changes in the intensity of the reflected light or a constant reflected intensity, i.e. a saturation intensity. By monitoring for the saturation intensity, the time for complete lateral etching of the sidewalls of the photoresist can be optimally determined and the etching process stopped and the substrate removed form the etching chamber. For example, as lateral etching of the sidewalls of the photoresist mask element progresses to about 0.12 micron, the intensity of reflected light remains constant The termination of lateral etching of the photoresist element can be optimally determined by monitoring for a constant reflected intensity.

In an anisotropic plasma etching environment the process that dominates between sidewall removal and deposition depends upon etch gas stoichiometry and the plasma reaction conditions, such as applied pressure, power and temperature parameters in the plasma chamber. An exemplary composition of the etchant mixture for etching a photoresist mask of the present invention comprises HBr, $O_2$ and an inert carrier gas, e.g. argon, in relative percentages of about 60, 10 and 30, respectively. By varying the concentration of etchant components, the photoresist line width can be changed from greater than zero to about 0.15 micron, e.g. from about 0.001 to about 0.1 micron.

In an embodiment of the present invention, increasing the amount $O_2$ of the component mixture decreases the patterned line width of the photoresist material during exposure of the photoresist mask in the plasma chamber. It is believed that the higher concentration of oxygen causes the sidewalls of the photoresist material to be etched away rapidly thereby reducing the line width dimension of the patterned photoresist mask without substantially affecting the underlying layers.

In accordance with the present invention, the width of photoresist elements is controlled by adjusting the etchant mixture. The lateral gain or loss accomplished in the lateral process is a function of the relative amount of the components of an etchant mixture in a plasma etch environment. Moreover, by increasing the line width of the photoresist and subsequently etching underlying layers, smaller spaces existing between the pattern lines can be effectively resolved.

In an embodiment of the present invention, a photoresist mask overlaying a composite arrangement, as shown in FIG. 1, is placed in a commercially available plasma etch tool having at least one window for monitoring the optical emission spectrum of the generated plasma. For example, increasing the ratio of HBr to $O_2$ of the etchant mixture increases the patterned line width of the photoresist mask. It is believed that the higher ratio of HBr to $O_2$ causes polymer build-up along the sidewalls of the photoresist material thereby increasing the line width dimension of the photoresist elements. Polymer build-up along the sidewalls of photoresist lines 18 increases the width of the photoresist elements to a second width $LW_2$ with a corresponding decrease in the width of the open space $SW_2$ without substantially affecting underlying ARC 16.

Etching the remaining layers employing the photoresist mask having the second width results in a gate electrode arrangement in accordance with the dimensions of the second width. Additional processing steps include conventionally etching ARC 16 using the etched photoresist having the second prescribed width as a mask. The polysilicon layer 14 is then etched according to the dimensions of the second width of the photoresist mask and ARC using conventional techniques, such as using a poly etcher in an HBr/$Cl_2$ plasma stopping on dielectric layer 12 in completion of forming the gate electrode structure. Further processing steps are then conducted in a conventional manner depending upon on the type of device contemplated.

The present invention advantageously enables manufacturing deep-submicron memory devices, such as sub 0.1 micron devices, with improved control over the critical dimensions of a gate electrode and higher integration in a simplified manner with increased device uniformity and reliability. The present invention is applicable to the manufacturing of various types of semiconductor devices, particularly semiconductor devices having a design rule of less than about 0.12 micron.

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A method laterally processing a photoresist mask on a substrate, which method comprises:
   depositing a layer of photoresist material on the substrate;
   patterning the photoresist layer to form a photoresist mask having at least one element with a first prescribed width;
   laterally processing the photoresist mask having the element to a second prescribed width in a plasma chamber having an etchant mixture;
   impinging a light on the substrate at a non-normal angle and detecting the reflected light from the substrate to directly measure the width of the element while simultaneously laterally processing the photoresist mask; and
   terminating the lateral process in response to a change detected in the reflected light corresponding to the second width.

2. The method of claim 1, comprising laterally processing the photoresist mask to decrease the first width of the element.

3. The method of claim 1, comprising impinging a laser light on the substrate and detecting the intensity of the reflected light by a photocell detector.

4. The method of claim 1, comprising patterning the photoresist layer to form the photoresist mask having the element with the first prescribed width of about 0.3 micron.

5. The method of claim 4, comprising laterally processing the first width to an increase or decrease of about 0.001 micron to about 0.1 micron.

6. The method of claim 4, comprising decreasing the first width to about 0.15 micron and detecting a corresponding change in the intensity of the reflected light.

7. The method of claim 1, further comprising removing the substrate when the detected light changes corresponding to the second width.

8. The method of claim 2, comprising laterally processing the photoresist mask with a mixture comprising HBr, oxygen and an inert gas as the etchant mixture.

9. A method of etching a feature on a semiconductor substrate, which method comprises:

forming a dielectric layer on the semiconductor substrate;

forming a conductive layer on the dielectric layer;

forming a photoresist mask having at least one element having a first width on the conductive layer;

laterally processing the photoresist mask having the element to a second prescribed width in a plasma chamber having an etchant mixture;

impinging a light on the substrate at a non-normal angle and detecting the reflected light from the substrate to directly measure the width of the element while simultaneously laterally processing the photoresist mask;

terminating the lateral process in response to a change detected in the reflected light corresponding to the second width; and etching through the photoresist mask having the element with the second width to the underlying layers to form the feature.

10. The method of claim 9, comprising laterally processing the photoresist mask to decrease the first width of the element.

11. The method of claim 9, comprising detecting a change in the intensity of the reflected light corresponding to the second width.

12. The method of claim 9, comprising impinging a laser light on the substrate and detecting the intensity of the reflected light by a photocell detector.

13. The method of claim 9, comprising patterning the photoresist layer to form the photoresist mask having the element with the first prescribed width of about 0.3 micron.

14. The method of claim 9, comprising laterally processing the first width to an increase or decrease of about 0.001 micron to about 0.15 micron.

15. The method of claim 9, comprising increasing the first width to about 0.1 micron and detecting a corresponding change in the intensity of the reflected light.

16. The method of claim 9, comprising laterally processing the photoresist mask with a mixture comprising HBr, oxygen and an inert gas as the etchant mixture.

17. The method of claim 9, comprising controlling the second width to about 0.18 micron.

18. The method of claim 9, comprising stopping the lateral process when the second width of the element is about 0.3 micron to about 0.12 micron.

19. The method of claim 9, comprising etching through the photoresist mask having the element with the second width to the underlying layers to form a gate electrode having a width of about 0.3 micron to about 0.12 micron.

20. A method laterally processing a photoresist mask on a substrate, which method comprises:

depositing a layer of photoresist material on the substrate;

patterning the photoresist layer to form a photoresist mask having at least one element with a first prescribed width;

laterally processing the photoresist mask having the element to a second prescribed width to an increase of about 0.001 micron to about 0.15 micron in a plasma chamber having an etchant mixture;

impinging a light on the substrate at a non-normal angle and detecting the reflected light from the substrate to directly measure the width of the element while simultaneously laterally processing the photoresist mask; and terminating the lateral process in response to a change detected in the reflected light corresponding to the second width.

* * * * *